United States Patent

Terayama

[11] 3,940,638
[45] Feb. 24, 1976

[54] THIN QUARTZ OSCILLATOR WITH SUPPORT OF LEADS

[76] Inventor: Toshio Terayama, 4-5-4-406, Nishikoiwa, Edogawa, Tokyo, Japan

[22] Filed: Sept. 4, 1973

[21] Appl. No.: 393,837

[30] Foreign Application Priority Data

Sept. 4, 1972  Japan............................ 47-103101

[52] U.S. Cl. .................. 310/9.4; 310/9.7; 310/9.8; 310/8.2
[51] Int. Cl.² ....................................... H01L 41/04
[58] Field of Search .............. 310/8.1, 8.2, 9.5, 9.6, 310/9.7, 9.8, 9.1, 9.4; 58/23 TF; 333/72

[56] References Cited
UNITED STATES PATENTS

| | | | |
|---|---|---|---|
| 2,289,954 | 7/1942 | Arndt, Jr. ............................ | 310/9.4 |
| 3,069,573 | 12/1962 | Leiv .................................. | 310/9.4 X |
| 3,162,780 | 12/1964 | Van Dalen et al................. | 310/9.4 X |
| 3,173,035 | 3/1965 | Fisher ................................ | 310/9.4 X |
| 3,488,530 | 1/1970 | Staudte ............................. | 333/72 X |
| 3,609,417 | 9/1971 | Kaname ............................ | 310/9.4 X |
| 3,683,213 | 8/1972 | Staudte ............................. | 310/9.6 |
| 3,697,766 | 10/1972 | Ganter et al...................... | 310/9.8 |
| 3,766,616 | 10/1973 | Staudte ............................. | 58/23 TF |

*Primary Examiner*—Mark O. Budd

[57] ABSTRACT

A thin quartz oscillator element including a substrate of quartz with a plurality of electrodes disposed on a major surface of the substrate and extending outwardly beyond one edge of the substrate. Metallic bodies are disposed on the same surface of the substrate as the electrodes remote from the electrodes. The electrodes thicken in the region that extends beyond the edge of the substrate to a sufficient thickness to be thereby reinforced. Another electrode made as a metallic layer is built-up on the opposite major surface of the quartz substrate. To construct the quartz oscillator, an upper and a lower major surface of a quartz substrate are lapped. The substrate is mounted on a jig, and a metallic layer is deposited on a surface of the substrate and extending from one end thereof. The metallic layer is coated with photo-resist, the photo-resist is exposed to light through a mask, and the photoresist is then developed to remove unexposed photoresist. Areas of the metallic layer unprotected by photo-resist are etched away to form the electrodes and the metallic body. The substrate is removed from the jig, cleaned of remaining photo-resist, and the surface bearing the electrode and metallic body is covered with a second mask. A gold metal layer is plated onto the metallic bodies and the electrodes to increase their thickness to a predetermined value to reinforce them. A lower electrode is built-up on the lower major surface of the quartz substrate in a similar manner but is not reinforced by the application of a gold layer.

6 Claims, 8 Drawing Figures

THIN QUARTZ OSCILLATOR WITH SUPPORT OF LEADS

BACKGROUND OF THE INVENTION

This invention relates generally to electro-mechanical resonators and more particularly to thin quartz crystal oscillators and a method for forming electrodes thereon.

Conventionally electrodes are connected to thin quartz oscillators by connecting to a terminal by bonding. However, thin quartz crystal oscillators have a frequency of, for example, 16KHz and are dimensioned very small, for example: 6mm in length, 0.9 mm in width and 0.025 mm in thickness. Since they are thin and fragile these quartz crystal oscillators are broken or cracked due to their subjection to pressure when bonding a connection thereto. Thus the yield in making problem-free electrode connections is not very good.

SUMMARY OF THE INVENTION

It is a principal object of the present invention to provide a new and improved quartz oscillator with built-on electrodes thereon.

Another object is to provide a quartz oscillator on which the electrodes are reinforced and can have connections made thereto without subjecting the quartz substrate thereof to pressure.

Still another object is to provide an improved quartz oscillator, a method of construction thereof and a method of connecting it in use greatly improving the yield thereof.

The quartz oscilator is constructed by taking a rectangular quartz substrate lapping both major surfaces, and depositing a metallic layer of chrome and gold over an entire major surface and extending laterally therefrom in the direction of the length of the substrate. A photoresist is applied to the metallic layer and then the photoresist is exposed to light through a mask that has exposure apertures thereon for forming a plurality of latent images of electrodes that overlie the substrate and extend laterally therefrom on that part of the layer that extends laterally from the substrate. The photoresist is developed and the portions of the photoresist not exposed are removed. The parts of the metallic layer unprotected by the photoresist are etched away and a plurality of electrodes are formed on the body of the substrate and having extensions that extend from one end of the substrate.

The mask is also constructed to expose a part of the metallic layer remote from the electrodes at an opposite end of the major surface of the substrate on which the electrodes are formed to form metallic masses thereon as later explained.

An electrode is formed on a major lower surface opposite to the above-mentioned major surface on which the plurality of electrodes are formed. This latter electrode is formed in the same manner in which the plurality of electrodes are formed.

Provision is made for thickening and reinforcing the electrodes. Thus gold plating is deposited, by using a mask, on the chrome and gold alloy extensions of the electrodes and limited regions of said electrodes overlying said substrate and near the extensions. A nickel plating may be applied thinly on those parts and regions to be gold plated. The gold plating forms a second metallic layer reinforcing or strengthening the structure. The masses are similarly gold plated so that they and the electrode extensions are thicker than the parts of the electrodes originally deposited as the first metallic layer.

The oscillator formed as set forth above is coated on both sides with chrome and secured to a jig in an inverted position. A photoresist is applied to the chrome on a surface opposed to the underside of the substrate and it is exposed through a mask and the photoresist is developed and removed in those regions unexposed. The chrome and quartz are then etched to form the quartz substrate into a U-shaped configuration each arm of which has an electrode extending therefrom and a mass on an end of each arm remote from the electrode. A third electrode has parts thereof on each arm of the substrate.

BRIEF DESCRIPTION OF THE DRAWINGS

Other features and advantages of the thin quartz oscillator element and its method of manufacture in accordance with the present invention will be better understood as described in the following specification and appended claims in conjunction with the following drawings in which:

DESCRIPTION OF THE PREFERRED EMBODIMENT

Figure 1A:
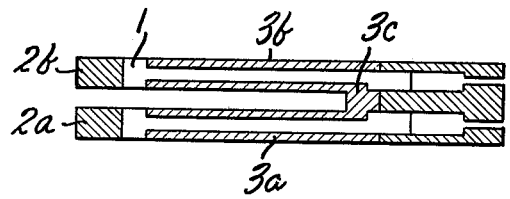
FIG. 1A is a plan view, partly in section, of a thin quartz oscillator element according to the present invention.
Figure 1B:
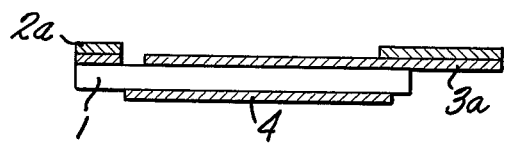
FIG. 1B is a side elevation sectional view of the thin quartz oscillator element shown in FIG. 1A.
Figure 2A:
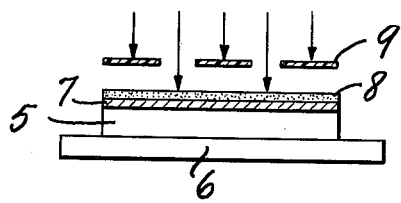
FIGS. 2A and 2B are schematic end views for illustrating a method of manufacturing the thin quartz oscillator element in FIG. 1A.
Figure 2B:
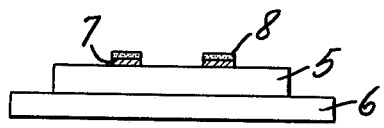

A thin quartz oscillator element constructed according to the invention is illustrated in FIGS. 1 and 2. It comprises a U-shaped quartz substrate 1 having two legs interconnected by a connecting third leg. Each of these legs can resonate and have metallic masses 2a, 2b on a free end on a major surface thereof. On the same major surface are disposed three electrodes 3a, 3b, and 3c. Each leg has an electrode thereon as shown and the intermediate electrode 3c extends axially on to both legs. All three electrodes have axial extensions extending from an end of the substrate in a direction of the length of the element and the substrate 1.

The two masses 2a, 2b are of greater thickness than parts of the electrodes as can be seen in FIG. 1B. However, the electrode extensions extending from one end of the body of the substrate and on regions overlying the substrate adjacent these extensions are likewise thickened and reinforced or strengthened.

In order to manufacture a thin quartz oscillator element according to the invention a new and improved method of manufacture is engaged. A thin rectangular quartz crystal 5 is provided from which the substrate 1 is to be formed. The major surfaces thereof are lapped.

The substrate 5 is very small similarly to those described above and is intended to be used in making an oscillator for a watch.

This substrate 5 is adhered to a jig 6 with an adhesive. A metallic first layer 7 of an alloy of chrome and gold is formed on a major surface of the quartz substrate 5 by evaporation. The jig 6 is constructed so that support is provided for an extension of this metallic layer which extends from an end of the body of the substrate and from which axially extending electrode extensions are to be formed. A photoresist 8 is coated on the entire metallic layer 7 which covers the major surface of the substrate 5.

A mask 9 is placed over the photoresist and aligned therewith. This mask is constructed with apertures to allow exposure of the photoresist in areas corresponding to the masses 2a, 2b and the three electrodes 3a, 3b and 3c. The photoresist is subjected to exposure to light through the mask 9 as shown diagrammatically by the arrows in FIG. 2A. Thus latent images of the masses and electrodes are formed on the photoresist.

The photoresist is then developed to remove the unexposed portions thereof. The metallic layer unprotected by the photoresist is etched away and the remaining portions of the metallic layer have the configuration of the masses 2a, 2b and the electrodes 3a, 3b, 3c.

The substrate 5 is then removed from the jig 6 and the remaining photoresist is removed.

A fourth electrode corresponding to the fourth electrode 4 on an underside of the substrate 5 is formed on an underside major surface of the quartz substrate opposite to the upper surface on which the three other electrodes are formed. This fourth electrode is formed using the same technique described with respect to the formation of the three electrodes.

Figure 3:
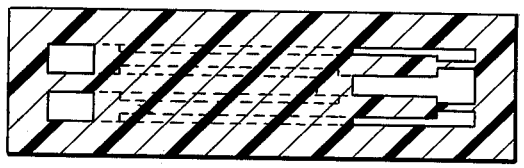
FIG. 3 is a plan view of a mask used in manufacturing a quartz oscillator element according to the invention.

As indicated heretofore the three upper electrodes 3a, 3b, 3c have parts thickened and the masses 2a, 2b on the two legs of the quartz substrate 1 are thickened. This is accomplished by placing over the substrate a mask constructed as shown in FIG. 3. Gold plating is then applied or deposited through the apertures in the mask to the masses on the substrate 5 corresponding to the masses 2a, 2b and to the electrodes formed thereon to form a second layer thereon. The first layer of the masses is completely covered. The electrode extensions and limited regions of the electrodes overlying the substrate are coated so that they are thickened to correspond to their structure in FIG. 1B. A thin nickel plating may first be applied to the areas on which the second gold metallic layer or plating is to be applied in order to more easily and better apply the gold layer or plating.

Figure 4A:
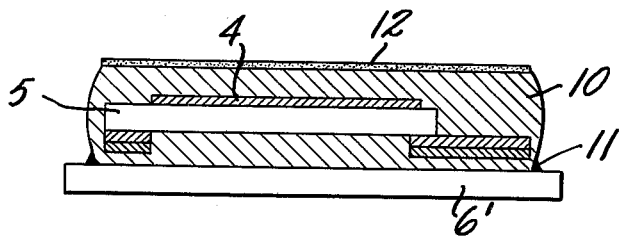
FIG. 4A is a schematic side elevation view of an element used in manufacturing the quartz oscillator element of FIG. 1A.

The quartz oscillator element in this state of assembly and construction is coated on both major surfaces, and the ends thereof, with a chrome 10 which is applied by evaporation. The element thus coated with chrome is adhered with an adhesive 11 to a jig 6' in an inverted position as shown in FIG. 4. A photoresist 12 is applied to a surface opposed to the underside electrode 4.

Figure 4B:
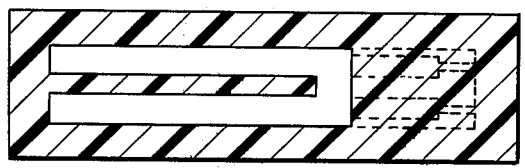
FIG. 4B is a plan view of another mask used in the manufacture of a quartz oscillator element according to the invention.

A mask constructed as shown in FIG. 4B is placed over the photoresist and it is exposed to light applied thereto through the mask. As can be seen this mask has a U-shaped aperture through which the light passes. The photoresist is then developed to remove unexposed portions of the photoresist. The chrome unprotected by photoresist is etched away and then the quartz is etched away so that the remaining quartz substrate has a U-shaped configuration corresponding to the exposure aperture of the mask as shown in FIG. 4B and as illustrated in FIG. 1B.

Figure 5:
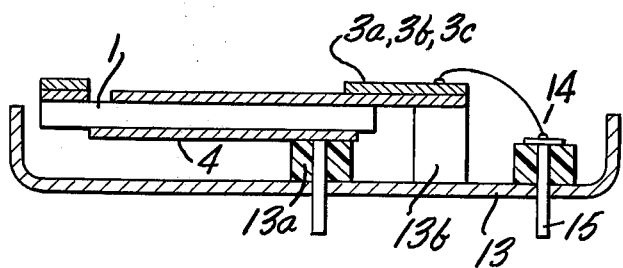
FIG. 5 is a side elevation view, partly in section, of an assembly of a quartz oscillator element of the invention into a timepiece.

As stated heretofore the quartz oscillator element is used in timepieces such as watches. An assembly thereof into a watch is illustrated in FIG. 5 in which a watch case 13 is provided with a first support projection 13a through which extends an axial terminal extending through the case and a second support projection 13b and a second terminal 15 extending through a third support projection and the case. The three supports are on a common side of the case as shown. The body of the oscillator element is supported on the first support projection 13a with its lower electrode in intimate electrical contact with the terminal in the first support projection. The extensions of the electrodes are supported on the second support projection 13b. A lead 14 is connected from the second terminal 15 to the upper electrodes 3a, 3b, 3c of the quartz oscillator element. The quartz oscillator element is not subjected to pressure when the lead 14 is bonded or otherwise secured to the upper electrodes 3a, 3b, 3c. The pressure developed is absorbed by the electrode support projection 13b. The watch case 13 is enclosed and sealed in a watch not shown. Thus the yield in the manufacture and the assembly of the thin quartz oscillator according to the invention is greatly improved.

What I claim and desire to secure by Letters Patent is:

1. In combination:
   a thin quartz substrate having a pair of opposed major surfaces and a longer length than a width thereof, a first metallic layer built-up on a major surface of said substrate and having an extension thereof extending laterally from an end of said substrate in a direction of the longer dimension defining an electrode integral and jointly with said first layer, a second metallic layer overlying said extension and extending over only a part of said first layer reinforcing said extension of said first layer and jointly therewith defining a strengthened electrode and a metallic mass comprising the same composition as said first layer disposed on said major surface spaced from said first layer and at an opposite end of said major surface,
   a case having a base plate;
   a first support extending from the base plate of said case and having means mounting said substrate thereon at the second major surface of said substrate opposite the first-mentioned major surface; and
   a second support extending from the base plate of said case and positioned to support a portion of said extension remote from said substrate.

2. A combination according to claim 1, in which said quartz substrate has a U-shaped configuration having two legs, and said legs each having a part of said mass on an end thereof remote from said electrode and on a same side as said first layer.

3. A combination according to claim 1, in which said quartz substrate has a U-shaped configuration having two legs, said first metallic layer overlies a portion of each of said legs of said substrate, said extension of said first metallic layer extends from an end of said substrate opposite said legs, and said second metallic layer overlies only said extension and a portion of said first metallic layer not overlying said legs of said substrate.

4. A combination according to claim 1 further comprising, a metallic layer defining another electrode on the second major surface of said substrate opposite the first-mentioned major surface, and wherein said first support is made of insulative material and includes means for making electrical contact with the electrode on the second major surface of said substrate.

5. A combination according to claim 1 further comprising, means for making electrical contact with the electrode on the second major surface of said substrate from a side of the base plate opposite the side from which said first and second supports extend, and means for making electrical contact from a side of the base plate opposite the side from which said first and second supports extend with said extension.

6. A combination according to claim 1 wherein said first metallic layer built-up on a surface of said substrate and said extension thereof are coplanar.

* * * * *